United States Patent
Wu et al.

(10) Patent No.: US 11,063,355 B2
(45) Date of Patent: *Jul. 13, 2021

(54) BI-DIRECTIONAL VECTOR MODULATOR/ACTIVE PHASE SHIFTER

(71) Applicant: Tubis Technology Inc., Pasadena, CA (US)

(72) Inventors: Kenny Kun-Long Wu, Pasadena, CA (US); James June-Ming Wang, Pasadena, CA (US)

(73) Assignee: Tubis Technology INC., Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/809,499

(22) Filed: Mar. 4, 2020

(65) Prior Publication Data

US 2020/0287282 A1    Sep. 10, 2020

Related U.S. Application Data

(60) Provisional application No. 62/813,337, filed on Mar. 4, 2019.

(51) Int. Cl.
*H01Q 3/36* (2006.01)
*H04B 1/50* (2006.01)
(Continued)

(52) U.S. Cl.
CPC ............... *H01Q 3/36* (2013.01); *H01Q 3/28* (2013.01); *H04B 1/001* (2013.01); *H04B 1/44* (2013.01); *H04B 1/50* (2013.01)

(58) Field of Classification Search
CPC ... H01Q 3/36; H01Q 3/28; H04B 1/50; H04B 1/001; H04B 1/44; H03C 5/00; H01P 5/16; H01P 1/18; H03H 11/20
See application file for complete search history.

(56) References Cited

U.S. PATENT DOCUMENTS 5,392,009 A * 2/1995 Talwar .................... H03C 1/14
                                                   333/109
7,535,409 B1 * 5/2009 Choe ...................... G01S 7/282
                                                   342/159

(Continued)

OTHER PUBLICATIONS

Soer et al. "Beamformer With Constant-Gm Vector Modulators and Its Spatial Intermodulation Distortion", Mar. 2017, IEEE JSSC, vol. 52, No. 3 (Year: 2017).*

*Primary Examiner* — Harry H Kim
(74) *Attorney, Agent, or Firm* — Imperium Patent Works; Zheng Jin

(57) ABSTRACT

A novel bi-directional vector modulator to be used as an active phase shifter is proposed. The advantages of the active phase shifter include: 1) Compact size—By active current combining technique, short transmission lines are used to perform signal combining rather than using area-consuming Wilkinson combiner or splitter; 2) High phase resolution and flexibility—phase interpolation can be performed by vector addition through m-path vector modulators; 3) High efficiency—no signal switch loss, only switched matching capacitor; 4) Simplified signal interconnection; 5) No passive combiner needed—eliminate large size and losses in the passive combiner); 6) Can have unequal combining and/or splitting by changing the gain of vector modulator, which is difficult to realize with passive combining and/or splitting network; and 7) Can combine different signals.

20 Claims, 6 Drawing Sheets

(51) Int. Cl.
    *H04B 1/00*     (2006.01)
    *H04B 1/44*     (2006.01)
    *H01Q 3/28*     (2006.01)
    *H03C 5/00*     (2006.01)
    *H01P 5/16*     (2006.01)
    *H01P 1/18*     (2006.01)
    *H03H 11/20*     (2006.01)

(56) References Cited

U.S. PATENT DOCUMENTS

| | | | |
|---|---|---|---|
| 10,848,116 B2 * | 11/2020 | Wu | H03G 1/0088 |
| 2004/0246193 A1 * | 12/2004 | Carey | H04L 27/362 |
| | | | 343/853 |
| 2020/0059208 A1 * | 2/2020 | Yang | H04B 1/525 |

* cited by examiner

BI-DIRECTIONAL VECTOR MODULATOR/ACTIVE PHASE SHIFTER

CROSS REFERENCE TO RELATED APPLICATIONS

This application claims priority under 35 U.S.C. § 119 from U.S. Provisional Application No. 62/813,337, entitled "Bi-Directional Vector Modulator/Active Phase Shifter," filed on Mar. 4, 2019, the subject matter of which is incorporated herein by reference.

TECHNICAL FIELD

The disclosed embodiments relate generally to wireless network communications, and, more particularly, to Bi-directional active phase shifter and four-quadrant vector modulator in phased array antenna.

BACKGROUND

The bandwidth shortage increasingly experienced by mobile carriers has motivated the exploration of the under-utilized Millimeter Wave (mmWave) frequency spectrum around 24G and 300G Hz for the next generation 5G broadband cellular communication networks. The available spectrum of mmWave band is hundreds of times greater than the conventional cellular system. The mmWave wireless network uses directional communications with narrow beams and can support multi-gigabit data rate. The under-utilized bandwidth of the mmWave spectrum has wavelengths ranging from 1 mm to 100 mm. The very small wavelengths of the mmWave spectrum enable large number of miniaturized antennas to be placed in a small area. Such miniaturized antenna system can produce high beamforming gains through electrically steerable arrays generating directional transmissions. To support directional communications with narrow beams in mmWave networks, a 5G base station typically supports multiple beams with phased-array antennas.

In antenna theory, a phased antenna array usually means an array of antennas that creates a beam of radio waves can be electronically steered to point in different directions, without moving the antennas. In the phased antenna array, the radio frequency current from the transmitter is fed to the individual antennas with the correct phase relationship so that the radio waves from the separate antennas add together to increase the radiation in a desired direction, while cancelling to suppress radiation in undesired directions. In the phased antenna array, the power from the transmitter is fed to the antennas through phase shifters, controlled by a processor, which can alter the phase electronically, thus steering the beam of radio waves to a different direction.

For a Time-Division Duplexing (TDD) beamforming integrated circuit (IC), the conventional approach is to use separate TX and RX paths, with high performance and easier design, but at the cost of large die area, complex routing, cross-coupling, and lossy. The industrial approach for TDD Phased-Array Antenna involves using active TX and RX amplifier block with input and output switches and shared routing and passive blocks (such as phase shifter). The industrial approach reduces routing, cross-coupling, and die area, but the input and output switches are lossy and the die area is still large. Bidirectional amplifier and shared routing and passive blocks (such as phase shifter) have been proposed with small die area, simplified routing, reduced coupling, and lower loss (no loss in input/output switched). However, it is difficult to design.

Conventional realization of a bi-directional amplifier uses an input/output switch and two amplifiers. Efficient implementation of the bi-directional amplifier without the input/output switch is feasible but it suffers several design constraints in matching network which limits the gain and the output power of the bi-directional amplifier. Passive phase shifter is a bi-directional implementation in which transmit signal or receive signal can enter from different (input/output) direction. The conventional phase shifter employs multiple stage design with each stage having a high pass path and a low pass path. By switching between the high pass or low pass, different phase shift value can be realized. The issue with passive phase shifter implementation is 1) Passive structure is lossy and needs additional amplifier to compensate the loss; and 2) The area of implementation increases with the number of stages.

A Uni-Directional Vector Modulator (Active Phase Shifter) can be employed to replace the passive phase shifter. The vector modulator uses a 90-degree splitter, two variable gain amplifiers, and an output summer. By adjusting the gain of two output paths of the 90-degree splitter, a one quadrant vector modulator can be formed. If the polarities of the two variable gain amplifiers can inverted (180 phase shift), the single quadrant phase shifter is expanded into 4-quadrant vector modulators (360-degree phase shifter). Note that the size of the vector modulator implementation is independent of number of phase shifter bits (phase shifter resolution). The phase shifter resolution depends on how the resolution of variable gain amplifier which can be the same size regardless how many gain steps available. However, the vector modulator is a one directional phase shifter, and both 90-degree splitter and passive summer occupy large area.

A solution is sought to improve the design of the conventional bi-directional amplifier, passive phase shifter, and uni-directional vector modulator.

SUMMARY

A novel bi-directional vector modulator to be used as an active phase shifter is proposed. The advantages of the active phase shifter include: 1) Compact size—By active current combining technique, short transmission lines are used to perform signal combining rather than using area-consuming Wilkinson combiner or splitter; 2) High phase resolution and flexibility—phase interpolation can be performed by vector addition through m-path vector modulators; 3) High efficiency—no signal switch loss, only switched matching capacitor; 4) Simplified signal interconnection; 5) No passive combiner needed—eliminate large size and losses in the passive combiner); 6) Can have unequal combining and/or splitting by changing the gain of vector modulator, which is difficult to realize with passive combining and/or splitting network; and 7) Can combine different signals.

In one embodiment, a BD vector modulator receives an input signal by a quadrature phase coupler coupled to two first matching networks (MN1s). The quadrature phase coupler converts the input signal to an I signal and a Q signal. The BD vector modulator amplifies the I signal by a first gain value using a first bi-directional variable gain amplifier (BD-VGA). The first BD-VGA outputs an I' signal onto a common node. The BD vector modulator amplifies the Q signal by a second gain value using a second BD-VGA. The second BD-VGA outputs a Q' signal onto the common node. The BD vector modulator performs active current summing or current sharing at the common node. The common node is coupled to a shared second matching network (MN2) for outputting an output signal. The first and the second BD-VGAs share the same MN2, and the BD vector modulator has adjustable input impedance and output impedance that match to the BD-VGAs for both switched amplifier directions.

Other embodiments and advantages are described in the detailed description below. This summary does not purport to define the invention. The invention is defined by the claims.

DETAILED DESCRIPTION

Reference will now be made in detail to some embodiments of the invention, examples of which are illustrated in the accompanying drawings.

Figure 1:
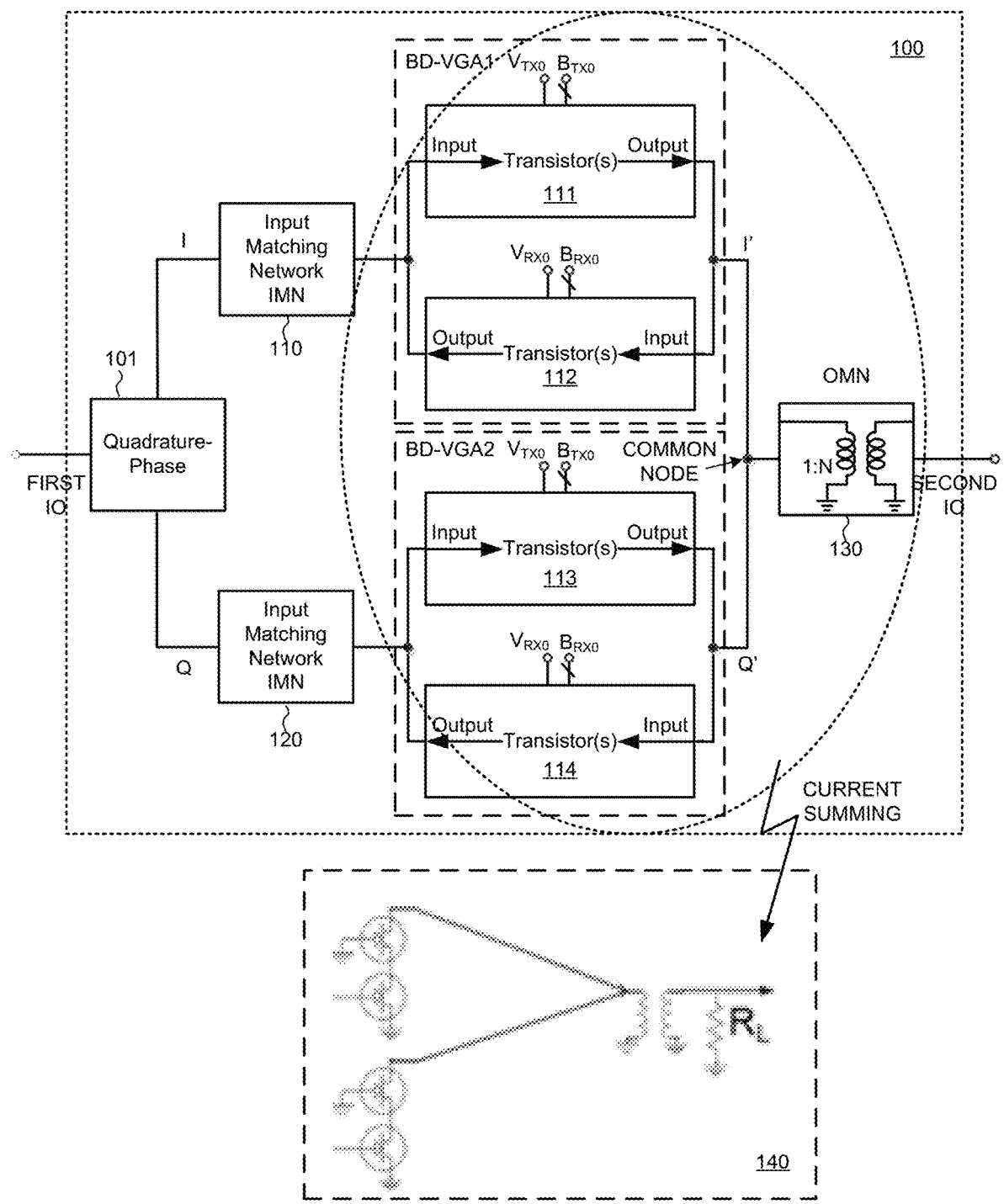
FIG. 1 is a simplified block diagram of a bi-directional vector modulator (active phase shifter) with active output combiner in accordance with one novel aspect.

FIG. 1 is a simplified block diagram of a bi-directional vector modulator (active phase shifter) 100 with active output combiner in accordance with one novel aspect. The bi-directional vector modulator 100 comprises a Quadrature-Phase coupler 101 coupled to a first input terminal for receiving signals, two input matching networks (IMN 110 and IMN 120), two high isolation bi-directional variable gain amplifiers (BD-VGA1 and BD-VGA2) with invertible polarity, and one shared output matching network (OMN 130) coupled to a second output terminal for transmitting signals. Control signals ($V_{TX0}$ and $V_{RX0}$) are used to select either transmitter or receiver mode signal flow direction, and control signals ($B_{TX0}$ and $B_{RX0}$) are used to assign gain level for each high isolation variable gain amplifier. Note that the bi-directional vector modulator 100 can operate in both signal flow directions, e.g., the first input terminal and IMNs can become output terminal and OMN, and the second output terminal and OMN can become input terminal and IMNs, respectively, for the reverse signal flow direction.

If the input signal enters through the Quadrature-Phase coupler 101 (from the left side), the input signal is split into I and Q signals, resulting in a 90-degree phase shift between the I and Q signals. The two variable gain amplifiers (BD-VGA1 and BD-VGA2) adjust the amplitudes of the I and Q signals and the resultant I' and Q' signals are summed to achieve any signal phase shift within a quadrant. If the polarity of each of the I and Q signals can be inverted, the phase shifting can cover four quadrants (360-degree). This above description is for the case when the signal enters from the Quadrature-Phase coupler (from the left side) and the second and fourth transistors (112 and 114) from the top of the BD-VGA1 and BD-VGA2 are turned off. If the input signal enters from the active summing (the right) side, the first and third transistors (111 and 113) from the top of the BD-VGA1 and BD-VGA2 are turned off. It is necessary to change the current summer into a current divider under the control of $V_{TX0}$ and $V_{RX0}$ which indicates the signal flow direction (enters from right side or left side). The input signal enters from the right side is divided into two equal phase signals which go through the two BD-VGAs before they are combined through the Quadrature-Phase coupler 101.

When signal amplification direction is changed, the switchable impedance matching circuit are incorporated to achieve input and output matching. The key idea is to make the input and output impedance of each transistor pair (the pair consists of transistors 111 and 112, and the pair consists of transistors 113 and 114) looks identical regardless of whether the signal enters from the right side or left side. To achieve this, the switchable impedance matching circuit is switched on in one amplifier direction and switched off in another amplifier direction. In a preferred embodiment, each BD_VGA comprises match loads with switched matching to achieve identical input and output impedance in both switched amplifier directions. The two matching networks (IMNs and OMN) connected to the opposite sides of the two BD-VGAs are identical, which requires the two BD-VGAs to have the identical impedance in either amplifier direction.

The novel active bi-directional vector modulator 100 can be used to create a high-resolution phase shifter. Traditionally, a vector modulator uses a 90-degree splitter, two variable gain amplifiers, and a passive output summer. Such traditional vector modulator is a one directional phase shifter, and both 90-degree splitter and passive summer occupy large area. The novel vector modulator 100 replaces two variable gain amplifiers and the passive output summer with an active combiner which uses current combining technique to sum up the output current from two the variable gain amplifiers BD-VGA1 and BD-VGA2 (with invertible polarity). The two variable gain amplifiers BD-VGA1 and BD-VGA2 adjust the output currents to achieve variable gain, and thereby achieving the phase shifting of four quadrants (360-degree phase shift). As depicted in FIG. 1, active amplifier summing circuit 140 occurs at the common node, which sums the output currents of the BD-VGA1 and BD-VGA2, and uses a shared output matching of OMN 130. Since only one output matching network (e.g., OMN 130) is used, the implementation is simplified with reduced IC area.

The output current combining or input current sharing mechanism may be realized by two ways. First, a cascode amplifier is used in each BD_VGA to achieve high output impedance and input to output isolation. Second, an output matching network (e.g., OMN, preferred to be a differential transformer coil), is placed at the right node to transform impedance, also used as a matching component and the amplifier load. Using the switch matching in the BD-VGAs, the condition for achieving impedance match of active combining or splitting is met where the (input) left node impedance of each of the BD-VGA maintains the same in both signal flow directions, and the (output) right node impedance of each of the BD-VGA maintains the same in both signal flow directions, implying the right node impedance of the connected right nodes of BD-VGAs maintains the same in both signal flow directions.

Figure 2:
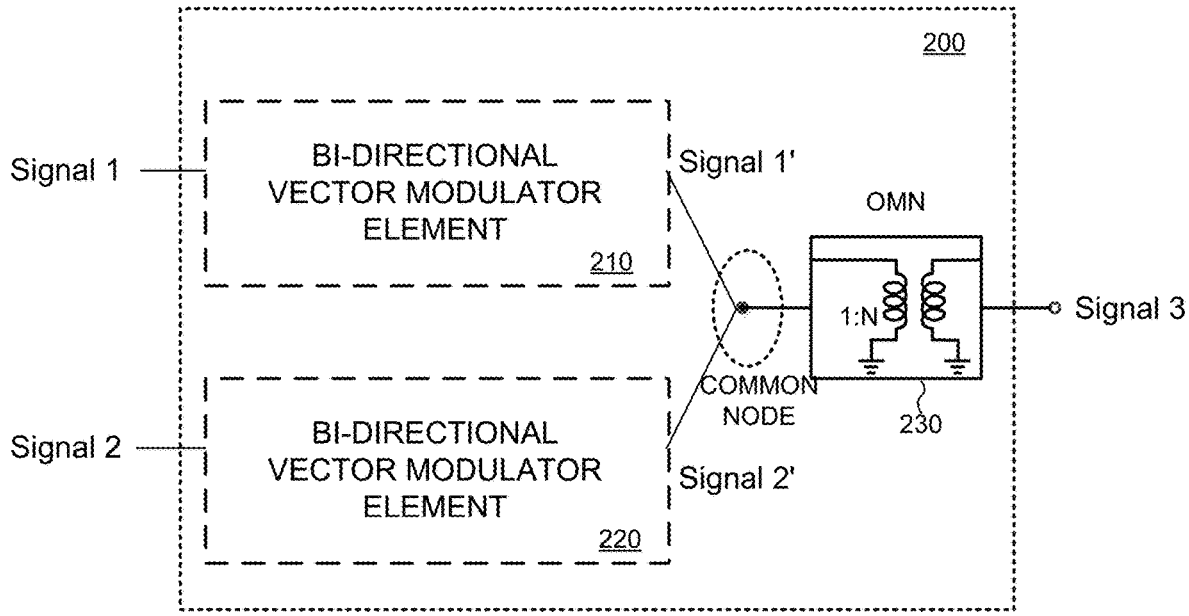
FIG. 2 is a simplified circuit diagram of the architecture of a two-way bi-directional vector modulator in accordance with one novel aspect.
Figure 2:
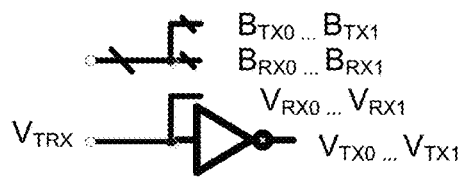

FIG. 2 is a simplified circuit diagram of the architecture of a two-way bi-directional vector modulator 200 in accordance with one novel aspect. The two-way bi-directional vector modulator (active phase shifters) 200 comprises a first bi-directional vector modulator element 210 and a second bi-directional vector modulator element 220, both coupled to a shared output matching network OMN 230. Each vector modulator element comprises two BD-VGAs, and each BD-VGA comprises a pair of transistors. Control signals ($V_{TX}$ and $V_{RX}$) are used to select either transmitter or receiver mode signal flow direction and control signals ($B_{TX}$ and $B_{RX}$) are used to assign phase shift value for each vector modulator element or each phase shifter. In the example of FIG. 2, phase shifter 210 performs phase shifting for Signal 1, phase shifter 220 performs phase shifting for Signal 2, and the resultant Signal 1' and Signal 2' are summed at OMN 230 and output as Signal 3 with a desired phase shift.

Current summing at the output matching network can be achieved in single phase shifter or sum of multiple phase shifters. To achieve the current summing, the output matching network OMN 230 must have significantly lower impedance than the output impedance of the transistor pairs in the BD-VGAs of the corresponding bi-directional vector modulator. Thus, the current from both pairs of transistors can flow to the output matching network. In FIG. 2, the bi-directional vector modulator 200 is a two-way modulator. All vector modulator elements have the same structure within the vector modulator. When the outputs from multiple vector modulator elements or phase shifters are to be summed, they can share the same OMN. Note that by expanding the vector modulator having two paths, the novel bi-directional vector modulator can have m paths to perform phase interpolation or multi-beam application for either transmitter or receiver purpose. The number of m depends on system requirement. The circuit can be generalized into N combiner/divider for high-resolution vector modulator use.

Figure 3:
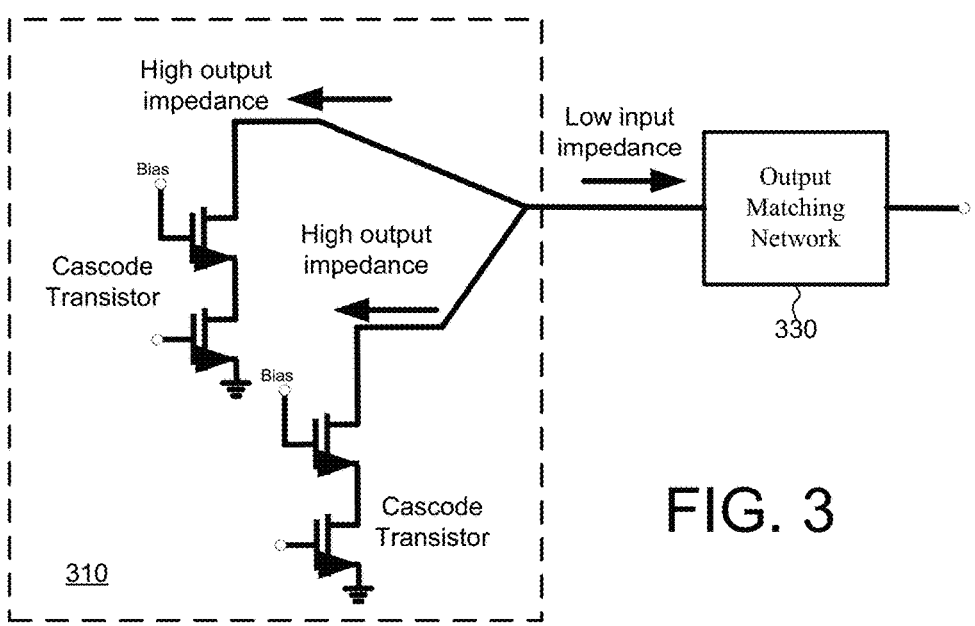
FIG. 3 illustrates the impedance situation for the output transistor and the input of output matching network in an active phase shifter.

FIG. 3 illustrates the impedance situation for the output transistor and the input of output matching network 330 in an active phase shifter. In a preferred embodiment of FIG. 3, a bi-directional BD-VGA 310 is implemented by using a pair of high isolation amplifiers consisting of complementary cascode transistor pair. (one transistor pair is on for a signal direction while the complementary pair is off). To achieve bi-directional matching, it is essential is to make the input and the output impedance (looking into the cascode transistor stacks) of the dual and interconnected complementary cascode transistor pair (one for each amplifier direction) unchanged when amplifier direction is switched. The pair of cascode amplifiers are connected in complementary for bi-directionality. The input of the first amplifier is connected to the output of the second amplifier and the output of the first amplifier is connected to the input of the second amplifier, and only one amplifier is active as controlled by the control signal, e.g., $V_{TRX}$.

Figure 4:
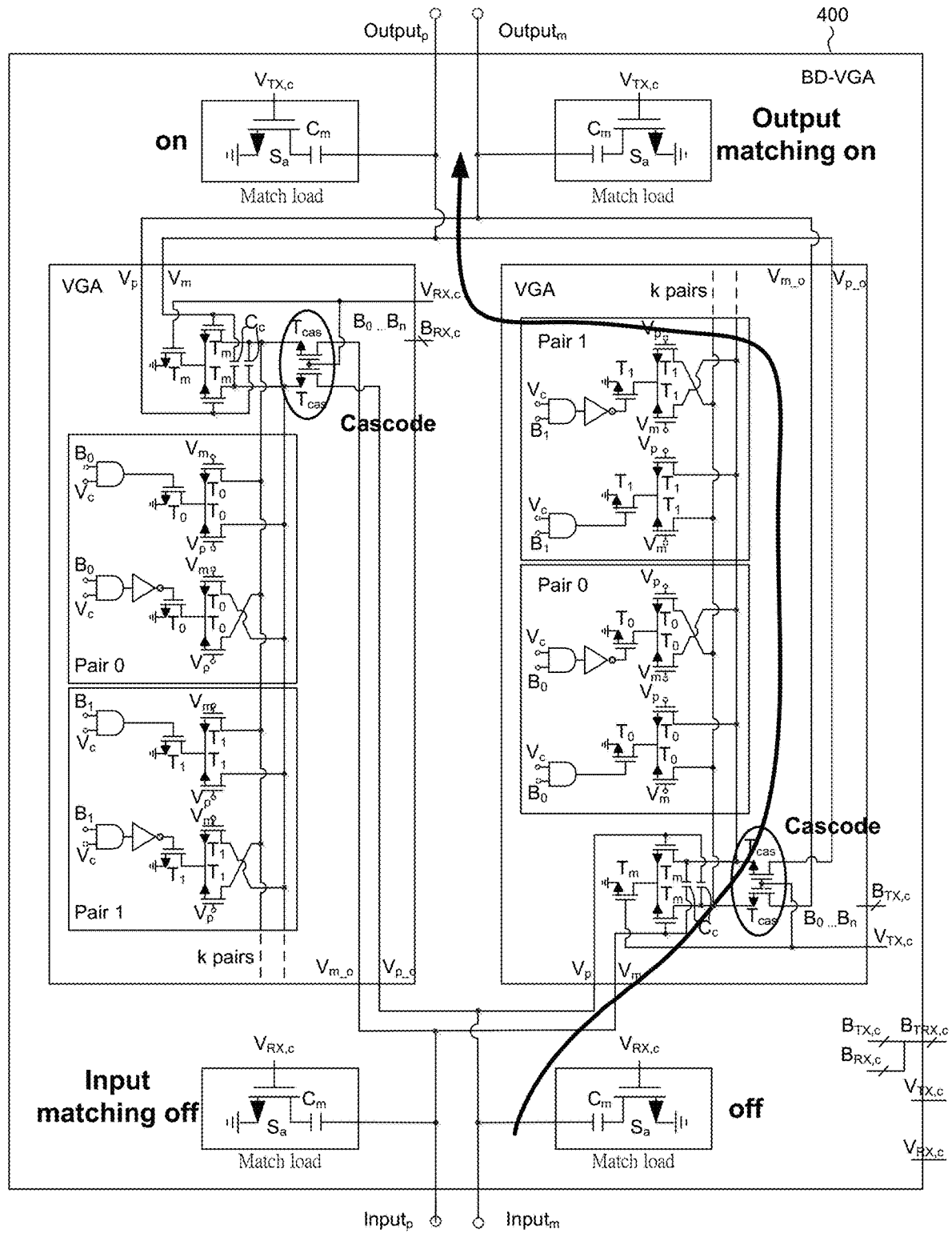
FIG. 4 illustrates a schematic of a bi-directional variable gain amplifier (BD-VGA).

FIG. 4 is a simplified circuit diagram of a bi-directional variable gain amplifier (BD-VGA) 400 having multiple gain steps and phase invariant design. A bi-directional variable gain amplifier (BD-VGA) is a sub-circuit of a bi-directional vector modulator/phase shifter, and it has two identical high isolation differential transistor pair inside, the output connection of the two differential transistor pair are reversed (one adding current, one subtracting current). Control $V_{TX,c}$, $V_{RX,c}$ are complementary to each other, in other words, either one of them would be 1 or 0. $V_{TX,c}$, $V_{RX,c}$ are used to turn on or off the high isolation VGAs. Control $B_{TRX,c}$ is used to assign gain value for the high isolation VGAs. The design for BD-VGA 400 can be divided into two parts: 1) high isolation variable gain amplifier, and 2) match load. Additional details of the BD-VGA design are described in U.S. patent application Ser. No. 16/711,215, entitled "Bi-Directional Variable Gain Active Combiner and Splitter", filed on Dec. 11, 2019, the subject matter of which is incorporated herein by reference.

For each high isolation VGA, it comprises stack cascode transistor, transconductance amplifier, phase compensation, and VGA control. The stack cascode transistor $T_{cas}$ is in common-gate configuration which can not only increase VGA's isolation but also VGA's output impedance. Transistor $T_m$ is main transconductance amplifier (main amplifier) which gives a reference gain level (main gain level). Each transconductance pair ($T_0$ to $T_n$) contains a positive transconductance amplifier and a negative transconductance amplifier. Negative transconductance is created by swapping output differential terminals with respect to positive transconductance amplifier. Positive transconductance amplifiers and negative transconductance amplifiers are complementary turned on or off by $B_0$ to $B_n$. Positive gain step is achieved via current summing to the main amplifier and negative gain step is achieved via current subtraction to the main amplifier. The amount of gain step is precisely controlled by the transistor size ratio between the gain step amplifier and the main amplifier. There are two separate gain controls, one for each signal direction.

$C_c$ can be made of metal-oxide-metal (MOM) capacitor or metal-insulator-metal (MIM) capacitor or transistor or diode or any kind of component that can contribute capacitance. One example is to use the MOM capacitor and it's capacitance is set equal to $T_m$'s intrinsic gate-to-drain capacitance to perform neutralization which means the $T_m$'s intrinsic gate-to-drain capacitance would be canceled out. It not only can compensate out the phase dependence when VGA's gain is changed but also increase VGA's isolation. $B_0$ and $B_1$ . . . are used to control the amplifier gain. Mechanism of variable gain amplifier is as follow. Maximum gain level is created when all negative transconductance in transconductance pairs are turned off. The second peak gain level is created when only one negative transconductance in transconductance pairs is turned on. The third peak gain level is created when only two negative transconductance in transconductance pairs are turn on, so on so forth. The transconductance ratio (size of transistor $T_0$ to $T_n$) is selected to create desired gain step. Total gain step number is equal to transconductance pair number k.

The match load is used to make input and output capacitance to be equal. In this way, the optimized matching can be simultaneously achieved at input and output. In transmitter mode, the match load at Bi-directional VGA's output will be turned on and the match load at input will be turned off. While in receiver mode, the match load at Bi-directional VGA's output will be turned on and the match load at input will be turned off. Only one cascode transistor stack is turned on at a time. The match load with the switch ($S_a$) attached to the cascode transistor stack is used to make the transistor impedance (capacitance) looks the same when one of the cascode transistor stack is switched off as when the cascode transistor stack is switched on. It switches on and off to connect or disconnect the capacitor ($C_m$), to create the same parasitic when the amplifier switches direction. Thus, it is matched in either amplifier direction (i.e., the same input matching network and output matching network work for both amplifier directions). It should be noted that the invention is not restricted to the switched capacitor embodiment, any other switched impedance structure which provides the same impedance in both directions can be adopted in the current invention.

$C_m$ can be made of metal-oxide-metal (MOM) capacitor or metal-insulator-metal (MIM) capacitor or transistor or diode or any kind of component that can contribute capacitance. The reason is explained as following. When in transmitter mode, input of bi-directional VGA would see a cascode amplifier's input capacitance $C_{gs}$ capacitance while output would see a cascode amplifier's output capacitance $C_{cas}$. Usually $C_{gs} \neq C_{cas}$ and if matching is optimized at specific frequency at input. For example, an inductor $L_1$ is used to resonate out $C_{gs}$ at specific frequency. Then in receiver mode, now the input become receiver's output, once again, inductor $L_2$ is used to resonate out $C_{cas}$ at the same frequency. Because $C_{mod} \neq C_{cas}$ so $L_1 \neq L_2$. If resonate frequency is the same, as a result, simultaneous matching of transmitter input and receiver output would not occur. Also, it is hard to change $L_1$ to $L_2$ or $L_2$ to $L_1$ on chip. On the other hand, by adding a capacitor $C_m$ to make $C_{mod} = C_{cas} C_m$, then the inductor could be used the same one to have the same resonate frequency. In other words, input and output of modulator can be simultaneously matched.

In accordance with one novel aspect, the proposed bi-directional vector modulator is an active phase shifter with low power implementation. The advantages of the proposed bi-directional vector modulator include: 1) Compact size—By active current combining technique, short transmission lines are used to perform signal combining rather than using area-consuming Wilkinson combiner or splitter; 2) High phase resolution and flexibility—phase interpolation can be performed by vector addition through m-path vector modulators; 3) High efficiency—no signal switch loss, only switched matching capacitor; 4) Simplified signal interconnection; 5) No passive combiner needed—eliminate large size and losses in the passive combiner); 6) Can have unequal combining/splitting by changing the gain of vector modulator, which is difficult to realize with passive combining/splitting network; and 7) Can combine different signals (note passive combiner will have losses in isolation resistor).

Figure 5:
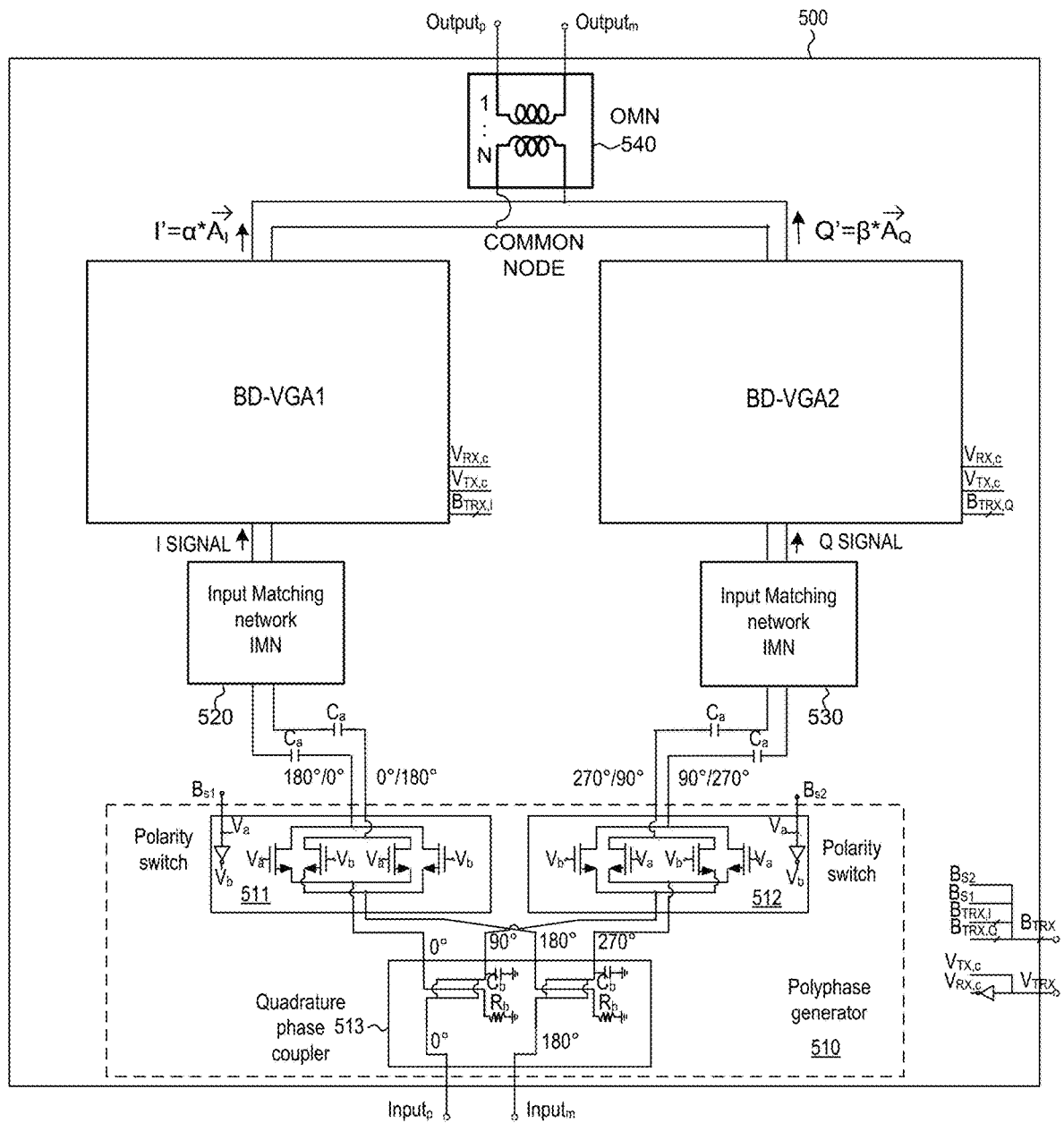
FIG. 5 illustrates a schematic of a bi-directional vector modulator for used in an active combiner/splitter in accordance with one novel aspect.

FIG. 5 illustrates a schematic of a bi-directional vector modulator 500 for used in an active combiner and/or splitter in accordance with one novel aspect. Bi-directional vector modulator 500 comprises a polyphase generator 510, a quadrature phase coupler 513, two polarity switches 511 and 512, two input matching networks 520 and 530, two aforementioned bi-directional VGAs, e.g., BD-VGA1 and BD-VGA2, and an output matching network 540. The schematic for BD-VGA1 and BD-VGA2 can be similar to BD-VGA 400 as depicted in FIG. 4. The polyphase generator 510 with polarity switches 511 and 512 are at the input of the Bi-directional vector modulator to generate quadrant (polyphase) signal (I, Q, I_bar, Q_bar), and a current combiner and/or splitter can be at the output of the Bi-directional vector modulator. $C_a$ is for DC-blocking. Control $V_{TX}$ and $V_{RX}$ are used to select either transmitter or receiver mode. Control $B_{TRX}$ are used to assign phase shift value. For example, $B_{TRX,I}$ is used to assign a first gain value of BD-VGA1 for the I signal, and $B_{TRX,Q}$ is used to assign a gain value of BD-VGA2 for the Q signal. In a phased-array antenna, an active combiner or splitter can be implemented with the proposed Bi-directional vector modulator. For example, all the Bi-direction vector modulator outputs (Output$_p$, Output$_m$) in the active combiner and splitter are connected together. The detailed explanation of Bi-directional vector modulator 500 is divided in two parts: 1) phase shift control as depicted in FIG. 6, and 2) polyphase generator as depicted in FIG. 7, to be illustrated below.

Figure 6:
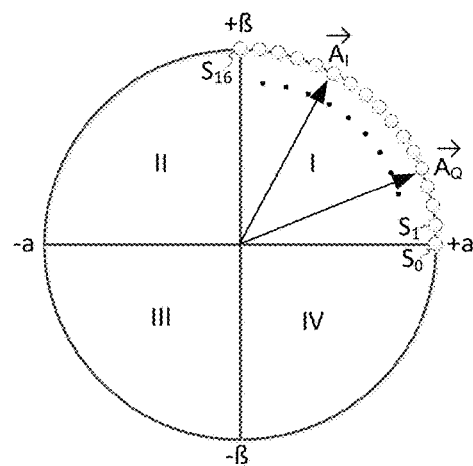
FIG. 6 illustrates the states constellation in polar coordinate system and phase shift control for a bi-directional vector modulator.
Figure 7:
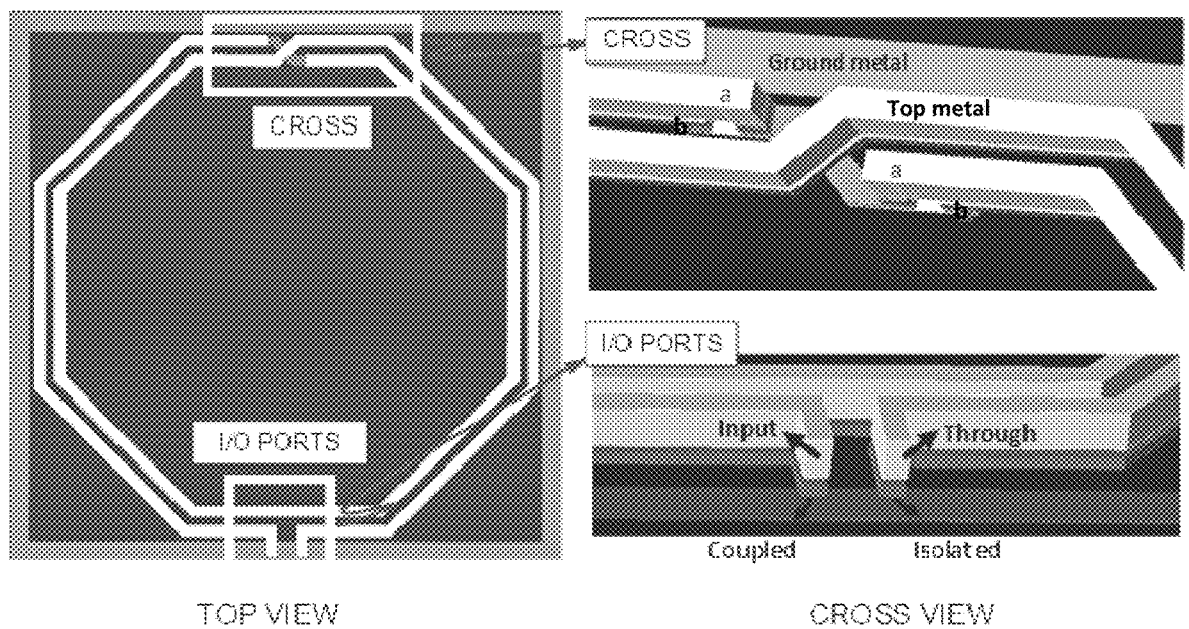
FIG. 7 illustrates the layout of coupled line in a polyphase generator to create four output signals for a bi-directional vector modulator.

FIG. 6 illustrates the states constellation in polar coordinate system and phase shift control for a bi-directional vector modulator 500 of FIG. 5. The phase shift mechanism is the mathematic vector addition. I-vector high isolation VGA (e.g., BD-VGA1 in FIG. 5) would contribute a $\alpha \cdot \vec{A}_I$ signal. Where $\alpha$ is amplitude of the signal, $\vec{A}_I$ is the unit vector of the signal. Similarly, Q-vector high isolation VGA (e.g., BD-VGA2 in FIG. 5) would contribute a $\beta \cdot \vec{A}_Q$ signal. Where $\beta$ is amplitude of the signal, $\vec{A}_Q$ is the unit vector of the signal. The output signal from the BD vector modulator 500 of FIG. 5, Output$_p$, is $$\text{Output}_p = \alpha \cdot \vec{A}_I + \beta \cdot \vec{A}_Q \tag{1}$$

Assume I-vector VGA is 90-degree phase difference with Q-vector VGA, then the $\vec{A}_I$ and $\vec{A}_Q$ are orthogonal. If we regard $\vec{A}_I$ as 0-degree phase reference and $\vec{A}_Q$ is positive 90-degree phase difference than $\vec{A}_I$. Output$_p$ then can be expressed in polar coordinate system as following:

$$\text{Output}_p = \sqrt[2]{\alpha^2 + \beta^2} \angle \tan^{-1} \frac{\beta}{\alpha} \tag{2}$$

Where $$\angle \tan^{-1} \frac{\beta}{\alpha}$$

is the phase shift $\sqrt{\alpha^2 + \beta^2}$ is the magnitude of signal

Therefore, by properly designing the amplitude gain values $\alpha$ and $\beta$ in the BD-VGAs, phase shifting can be performed with a desired phase. Note that control signals $B_{s1}$, $B_{s2}$ in polarity switches 511 and 512 give the ability to assign whether $\alpha$ and $\beta$ is positive or negative value. As shown in FIG. 5, once states in quadrant I have been constructed, the other states in quadrant II, III, IV, can also be constructed by simply controlling $B_{s1}$, $B_{s2}$ to change the sign of $\alpha$ and $\beta$. In the example of FIG. 5, the polarity switches are included in the polyphase generator. In another example, the polarity switches may be included in the BD-VGAs.

The value of $\alpha$ and $\beta$ can be scaled by multiplying a real number. To maintain the same magnitude for each state, $\alpha$ and $\beta$ are designed as cosine and sine function. The uniform signal phase step is controlled by a set of non-uniform amplitude steps of the I'=$\alpha \cdot \vec{A}_I$ and Q'=$\beta \cdot \vec{A}_Q$ signals. Note that the non-uniform steps are obtained from the projection of signal constellation onto I and Q axis. To make the circuit to be realizable, the value of $\alpha$ and $\beta$ are carefully designed to prevent too much digitals number after its decimal point. Control $B_n$ is used to choose the Gm sign of the transconductance pairs, in other words, to decide whether positive or negative Gm the transconductance pair is. The total Gm for the VGA can be expressed as following:

$$\text{Total } Gm = Gm_{main} + \sum_{i=0}^{n-1} K_i \cdot Gm_i. \quad (3)$$

Where $Gm_{main}$ is the Gm of main transconductance stage, $Gm_i$ are the Gm of transconductance pairs, $K_i$ is the value of 1 or −1 depending on control bits $B_n$, n is the number of transconductance pairs.

By properly designing the transistor size for main stage transconductance and the transconductance pairs, the desired α and β can be derived with some scaling task. Note that the output loading is very stable when Gm is changed in the BD-VGAs owing to the neutralization of the transistor. That is, the change of output signal magnitude is only depending on VGA's Gm.

Note that the gain steps of the first variable gain amplifier are determined by the projection of each phase point onto α axis, i.e., r*cos(θi). Thus, the gain steps of the first variable gain amplifier are not uniform. The gain step controlled by each differential transistor pair is proportional to the transistor size (width). The second variable gain amplifier implements the project of phase points onto β axis, i.e., r*sin(θi). Similarly, the gain step controlled by each differential transistor pair in the second variable gain amplifier is proportional to the transistor size (width).

To extend the phase range from 90 degree to 360 degree, the polarity switch is designed in the vector modulator. It can swap the signal by controlling $B_{s1}$, $B_{s2}$, in other words, it can make the signal be with positive or negative sign. The value of α and β then can be either positive or negative. That is, states in quadrant I can be transformed to quadrant II, III, or IV by the sign change of α and β. Note that in m paths vector modulator, each path of vector modulator represents a vector that can be added or subtracted by others based on vector addition mathematic of equation (1). There will be m vectors to be signal combined which can further increase the phase resolution, as compared to only one path vector modulator is adopted.

FIG. 7 illustrates the layout of coupled lines in a polyphase generator to create four output signals for a bi-directional vector modulator. The polyphase generator 510 in FIG. 5 is one example of the Quadrature-Phase coupler 101 in FIG. 1. Other embodiments of the Quadrature-Phase coupler include branch line hybrid, 90-degree coupler, or their lumped element equivalent. The purpose of the polyphase generator 510 is to create four output signals with 0°, 90°, 180°, 270° phase and equal magnitude. Note that the I and Q signals are (0°,90°), and the other two signals I_bar and Q_bar are (180°,270°). The four output signals (0°, 90°, 180°, 270°) are quadrature signals. There could be a R-C network (so called polyphase filter), or L-C network, or hybrid-coupler, or transformer circuit or any circuit that could produce polyphase signal. One example is the two coupled lines as shown in FIG. 7 as following.

The coupled lines are designed by two vertically-coupled metal lines for symmetricity, and is with spiral geometric. The spiral geometric is to increase inductive energy stored in the couple lines and to reduce area consumptions. The couple lines with high inductive energy can slow the signal wave velocity, and can make it reach the quarter-wave resonate frequency under smaller area occupation. Coupled line's input and through ports are at top metal, while coupled and isolated ports are at the metal which is below the top metal. The ground is at bottom metal. The isolated port will be terminated by 50 ohm resistance, $R_b$, as depicted in FIG. 5. In cross interconnection, two "a" mean they would be physically connected to each other. Similarly, two "b" are physically connected to each other.

For phase compensation, the through port would be 90-degree phase lagging to couple port by coupled line natural response. Due to through port is at top metal which is farer from ground located at bottom metal layer than coupled port, the through port would be less than 90-degree phase lagging to coupled port. As depicted in FIG. 5, an additional shunted $C_b$ capacitor is added at through port to compensate out their difference on parasitic capacitor to ground. Note $C_b$ can be any kind of component that contributes capacitance. By doing so, phase difference between through port and couple port could be maintain to 90 degree.

Figure 8:
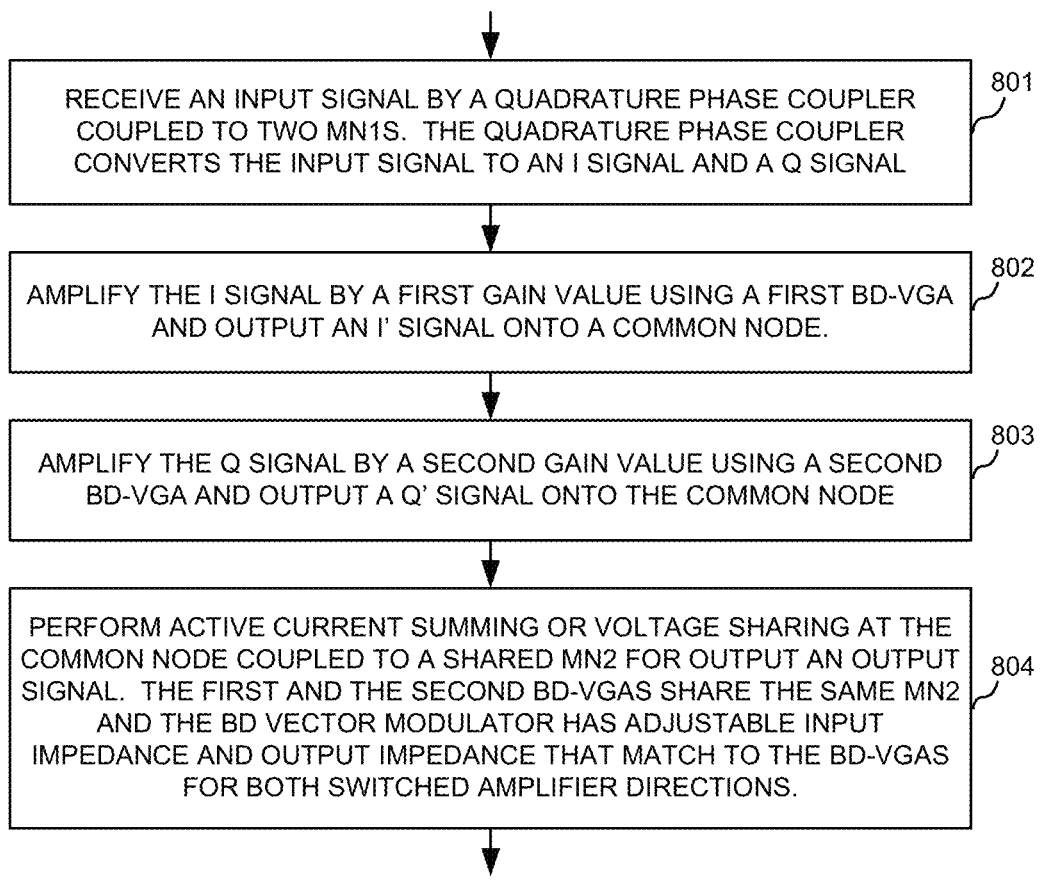
FIG. 8 is a flow chart of a method of phase shifting using a bi-directional vector modulator in accordance with one novel aspect.

FIG. 8 is a flow chart of a method of phase shifting using a bi-directional vector modulator in accordance with one novel aspect. In step 801, the BD vector modulator receives an input signal by a quadrature phase coupler coupled to two first matching networks (MN1s). The quadrature phase coupler converts the input signal to an I signal and a Q signal. In step 802, the BD vector modulator amplifies the I signal by a first gain value using a first bi-directional variable gain amplifier (BD-VGA). The first BD-VGA outputs an I' signal onto a common node. In step 803, the BD vector modulator amplifies the Q signal by a second gain value using a second BD-VGA. The second BD-VGA outputs a Q' signal onto the common node. In step 804, the BD vector modulator performs active current summing or current sharing at the common node. The common node is coupled to a shared second matching network (MN2) for outputting an output signal. The first and the second BD-VGAs share the same MN2, and the BD vector modulator has adjustable input impedance and output impedance that match to the BD-VGAs for both switched amplifier directions.

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. A bi-directional (BD) vector modulator, comprises:

a quadrature-phase coupler coupled to a first Input Output (IO) terminal and two first matching networks (MN1s), wherein the quadrature phase coupler converts an input signal to an I signal and a Q signal;

a first bi-directional variable gain amplifier (BD-VGA) that receives the I signal, wherein the first BD-VGA amplifies the I signal by a first gain value and outputs an I' signal onto a common node;

a second BD-VGA that receives the Q signal, wherein the second BD-VGA amplifies the Q signal by a second gain value and outputs a Q' signal onto the common node; and a shared second matching network (MN2) coupled to the common node and a second IO terminal for outputting an output signal, wherein the first and the second BD-VGAs share the same MN2, wherein the BD vector modulator has adjustable input impedance and output impedance that match to the BD-VGAs for both switched amplifier directions, wherein input signals flow from the first IO terminal to the quadrature phase coupler, wherein output currents from the BD-VGAs are summed onto the common node, wherein the MN become input matching networks, wherein the MN2 becomes an output matching network for the BD vector modulator, wherein input signals flow from the second IO terminal to the MN2, wherein an input current on the common node is shared by the BD-VGAs, wherein the MN1s become output matching networks, and wherein the MN2 becomes an input matching network for the BD vector modulator.

2. The BD vector modulator of claim 1, wherein current summing or current sharing occurs on the common node and thereby achieving active combining or splitting, for both switched amplifier directions without using passive structures.

3. The BD vector modulator of claim 1, wherein each BD-VGA is formed by a pair of high isolation cascode amplifiers to provide input and output isolation, wherein the pair of cascode amplifiers are connected in complementary for bi-directionality.

4. The BD vector modulator of claim 1, wherein each BD-VGA comprises a pair of amplifiers that provides a main gain level and a set of positive and negative gain steps to achieve variable gain levels in both switched amplifier directions.

5. The BD vector modulator of claim 1, wherein each BD-VGA comprises adjustable match loads with switched matching to achieve matched input and output impedance in both switched amplifier directions.

6. The BD vector modulator of claim 1, wherein the output signal phase is controlled by at least the amplitudes of the I' and Q' signals.

7. The BD vector modulator of claim 1, wherein the output signal phase is controlled by a set of non-uniform amplitude steps of the I' and Q' signals.

8. The BD vector modulator of claim 1, wherein each BD-VGA further comprises a polarity switch to create a four-quadrant phase shifter.

9. The BD vector modulator of claim 1, wherein a polyphase generator comprises the quadrature-phase coupler and two polarity switches to create four-quadrant phase signals with equal magnitude.

10. The BD vector modulator of claim 1, wherein the quadrature phase coupler, the MN1s, and the first and the second BD-VGAs form a BD vector modulator element, and wherein the BD vector modulator comprises multiple BD vector modulator elements sharing the same MN2.

11. A method of active phase shifting using a bi-directional (BD) vector modulator, comprising:

receiving an input signal by a quadrature phase coupler coupled to a first Input Output (IO) terminal and two first matching networks (MN1s), wherein the quadrature phase coupler converts the input signal to an I signal and a Q signal;

amplifying the I signal by a first gain value using a first bi-directional variable gain amplifier (BD-VGA), wherein the first BD-VGA outputs an I' signal onto a common node;

amplifying the Q signal by a second gain value using a second BD-VGA, wherein the second BD-VGA outputs a Q' signal onto the common node; and performing active current summing or current sharing at the common node, wherein the common node is coupled to a shared second matching network (MN2) coupled to a second IO terminal for outputting an output signal, wherein the first and the second BD-VGAs share the same MN2, wherein the BD vector modulator has adjustable input impedance and output impedance that match to the BD-VGAs for both switched amplifier directions, wherein input signals flow from the first IO terminal to the quadrature phase coupler, wherein output currents from the BD-VGAs are summed onto the common node, wherein the MN become input matching networks, wherein the MN2 becomes an output matching network for the BD vector modulator, wherein input signals flow from the second IO terminal to the MN2, wherein an input current on the common node is shared by the BD-VGAs, wherein the MN1s become output matching networks, and wherein the MN2 becomes an input matching network for the BD vector modulator.

12. The method of claim 11, wherein current summing or current sharing occurs the common node and thereby achieving active combining or splitting, for both switched amplifier directions without using passive structures.

13. The method of claim 11, wherein each BD-VGA is formed by a pair of high isolation cascode amplifiers to provide input and output isolation.

14. The method of claim 11, wherein each BD-VGA comprises a pair of amplifiers that provides a main gain level and a set of positive and negative gain steps to achieve variable gain levels in both switched amplifier directions.

15. The method of claim 11, wherein each BD-VGA comprises adjustable match loads with switched matching to achieve matched input and output impedance in both switched amplifier directions.

16. The method of claim 11, wherein the output signal phase is controlled by at least the amplitude of the I' and Q' signals.

17. The method of claim 11, wherein the output signal phase is controlled by a set of non-uniform amplitude steps of the I' and Q' signals.

18. The method of claim 11, wherein each BD-VGA further comprises a polarity switch to create a four-quadrant phase shifter.

19. The method of claim 11, wherein a polyphase generator comprises the quadrature-phase coupler and two polarity switches to create four-quadrant phase signals with equal magnitude.

20. The method of claim 11, wherein the quadrature phase coupler, the MN1s, and the first and the second BD-VGAs form a BD vector modulator element, and wherein the BD vector modulator comprises multiple BD vector modulator elements sharing the same MN2.

* * * * *